United States Patent
Chyun

(10) Patent No.: US 9,973,003 B2
(45) Date of Patent: May 15, 2018

(54) MULTIPLE-TUNED FILTER DESIGN METHOD FOR HVDC SYSTEM

(71) Applicant: LSIS CO., LTD., Anyang-si, Gyeonggi-do (KR)

(72) Inventor: Yi Kyung Chyun, Ansan-si (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 537 days.

(21) Appl. No.: 14/815,740

(22) Filed: Jul. 31, 2015

(65) Prior Publication Data

US 2016/0126823 A1    May 5, 2016

(30) Foreign Application Priority Data

Oct. 30, 2014   (KR) .................. 10-2014-0149127
Apr. 17, 2015   (KR) .................. 10-2015-0054781

(51) Int. Cl.
*H02J 3/36*     (2006.01)
*H03H 7/06*     (2006.01)
*H03H 7/01*     (2006.01)

(52) U.S. Cl.
CPC .............. *H02J 3/36* (2013.01); *H03H 7/06* (2013.01); *H03H 7/1716* (2013.01); *H03H 7/1758* (2013.01); *H03H 7/1775* (2013.01); *H03H 7/1791* (2013.01); *H02J 2003/365* (2013.01); *Y02E 60/60* (2013.01)

(58) Field of Classification Search
CPC ....................................................... H02J 3/36
USPC ....................................................... 307/105
See application file for complete search history.

(56) References Cited

U.S. PATENT DOCUMENTS

| 5,751,563 A | 5/1998 | Bjorklund |
| 5,768,392 A | 6/1998 | Graupe |
| 5,910,889 A * | 6/1999 | Larsen ............... H02J 3/01 |
| | | 307/105 |

FOREIGN PATENT DOCUMENTS

| CN | 101026303 | 8/2007 |
| CN | 103795061 | 5/2014 |
| JP | H10502795 | 3/1998 |
| JP | 2002034151 A | 1/2002 |
| KR | 101152362 | 5/2012 |
| KR | 20140029687 A | 3/2014 |
| KR | 10-2014-0125213 | 10/2014 |

OTHER PUBLICATIONS

Chinese Office Action Appl. No. 201510728884.7 dated Sep. 4, 2017—7 pages.

(Continued)

*Primary Examiner* — Joseph Chang
(74) *Attorney, Agent, or Firm* — K&L Gates LLP

(57) ABSTRACT

A method of designing a multiple-tuned filter (MTF) of a high voltage direct current (HVDC) system is provided. The method includes selecting an input parameter for the MTF, setting a resonance frequency of the MTF, calculating values of inductance (L) and capacitance (C) which are filter parameters of the MTF on the basis of the input parameter and the resonance frequency, combining a value of resistance (R) with the filter parameters and calculating a price according to the combination, and storing the combined values of R, L, and C when the calculated price falls within a predetermined price range.

10 Claims, 7 Drawing Sheets

(56) References Cited

OTHER PUBLICATIONS

Hao, "The Algorithm for the Parameters of AC Filters in HVDC Transmission System," Key Project of the National Eleventh-Five Year Research Programme of China (20063AA02A21); 978-1-4244-1904-3/08 IEEE—pp. 1-6.
Hsiao, "Design of Filters for Reducing Harmonic Distortion and Correcting Power Factor in Distribution Systems," Tamkang Journal of Science and Engineering, vol. 4, No. 3, pp. 193-1999 (2001).
Korean Office Action for related Korean Application No. 10-2014-0149127; action dated Feb. 1, 2018; (6 pages).
Li, et al., "The Algorithm for the Parameters of AC Filters in HVDC Transmission System," Transmission and Distribution Conference and Exposition, XP31250191, Apr. 2008, 6 pages.
Hsiao, "Design of Filters for Reducing Harmonic Distortion and Correcting Power Factor in Industrial Distribution Systems," Tamkang Journal of Science and Engineering, XP55261962, Sep. 2001, 7 pages.
European Patent Office Application Serial No. 15179778.4, Search Report dated Apr. 11, 2016, 11 pages.
Korean Intellectual Property Office Application No. 10-2014-0149127, Office Action dated Jul. 20, 2017, 46 pages.
Japan Patent Office Application Serial No. 2015-172890, Office Action dated Sep. 6, 2016, 4 pages.

\* cited by examiner (a)  (b)  (c)

MULTIPLE-TUNED FILTER DESIGN METHOD FOR HVDC SYSTEM

CROSS-REFERENCE TO RELATED APPLICATIONS

Pursuant to 35 U.S.C. § 119(a), this application claims the benefit of earlier filing date and right of priority to Korean Patent Application Nos. 10-2014-0149127, filed on Oct. 30, 2014, and 10-2015-0054781, filed on Apr. 17, 2015, the contents of which are all hereby incorporated by reference herein in their entirety.

BACKGROUND

The present disclosure relates to a method of designing a multiple-tuned filter (hereinafter, referred to as an MTF) according to characteristics of a high voltage direct current (hereinafter, referred to as an HVDC) system.

In an HVDC system, a harmonic filter suppresses harmonics, which are generated while power is converted by operating a converter, from being introduced into an alternating current (AC) system and also serves as a reactive power source due to consumption of reactive power. Most current-type HVDC systems operate with 12 pulses and thus generate $(12\pm1)$th characteristic harmonics such as 11th, 13th, 23rd, and 25th harmonics. In particular, 11th and 13th harmonics have large amplitudes, and thus 11th and 13th filters are used to reduce the 11th and 13th harmonics.

In a current-type HVDC system, most converters operate with 12 pulses. The ±80 kV 60 MW HVDC system in Jeju island of South Korea also includes a 12-pulse converter that uses serial connection of two 6-pulse groups.

In an HVDC system, a single tuned filter (STF) or a double tuned filter (DTF) is widely used as a harmonic filter. Equations associated with a serial or parallel impedance of the filter may be used to design such a filter.

In the filter design, since passive elements included in the filter may be determined through manual calculation on the basis of their designed ratings and performance, there is no accurate, efficient, and standardized method.

Furthermore, when the filter is designed, there is no solution considering prices. Thus, in view of manufacturers, a design method that may consider production cost as well as performance has not been proposed yet.

SUMMARY

Embodiments provide a method and device for designing an MTF and a damped-type MTF according to characteristics of the HVDC system.

Embodiments also provide an algorithm that may reduce a space that is needed for general harmonic filter design according to an order of harmonics generated by the HVDC system and may also design a filter in consideration of both of a loss and a price.

In one embodiment, a method of designing a multiple-tuned filter (MTF) of a high voltage direct current (HVDC) system includes: selecting an input parameter for the MTF; setting a resonance frequency of the MTF; calculating values of inductance (L) and capacitance (C) which are filter parameters of the MTF on the basis of the input parameter and the resonance frequency; combining a value of resistance (R) with the filter parameters and calculating a price according to the combination; and storing the combined values of R, L, and C when the calculated price falls within a predetermined price range.

The details of one or more embodiments are set forth in the accompanying drawings and the description below. Other features will be apparent from the description and drawings, and from the claims.

DETAILED DESCRIPTION OF THE EMBODIMENTS

Hereinafter, embodiments will be described in detail with reference to the accompanying drawings.

Figure 1:
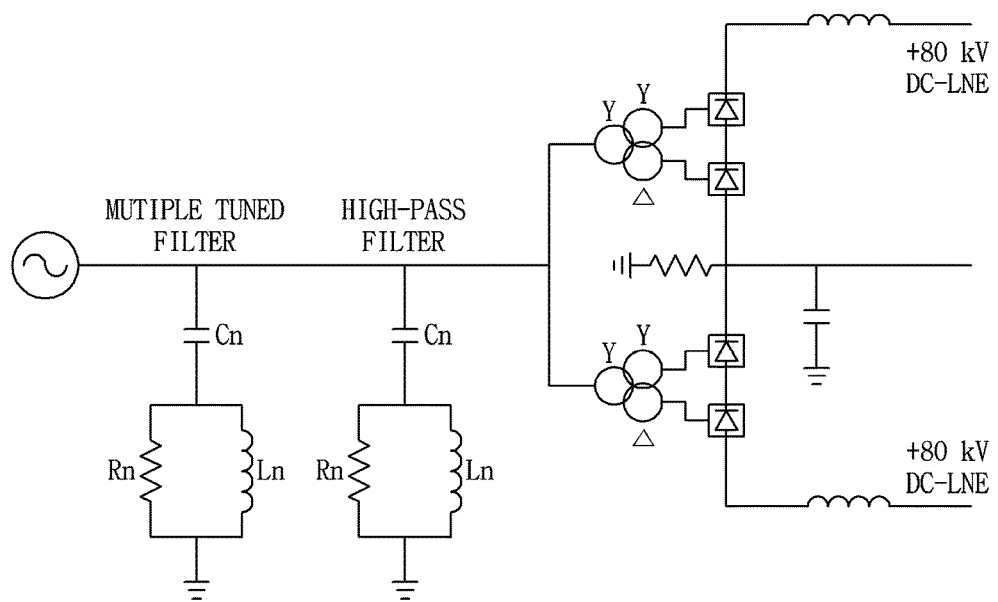
FIG. 1 is a circuit diagram illustrating a general high voltage direct current (HVDC) system.

FIG. 1 is a circuit diagram illustrating a general high voltage direct current (HVDC) system.

Referring to FIG. 1, in an HVDC system, a multiple-tuned filter (MTF) that may be installed in an 80 kV HVDC system is illustrated. The 80 kV HVDC system has a typical bipolar system and has characteristics in which two electrodes include the same 12-pulse converter.

The converter of the HVDC may generate harmonic current greater than or equal to a predefined value. Accordingly, without being filtered out, the harmonic current may generate distortion in an AC voltage, thus preventing the system from being normally operated.

The harmonic filter may have an impedance forming a small parallel line to allow harmonic current to flow out through the line and thus may serve to make the distortion of the AC voltage fall within an acceptable range.

The 12-pulse converter has $(12n\pm1)$th characteristic harmonics. Accordingly, harmonic components that should be filtered out may be 11th, 13th, 23rd, and 25th components. The higher order harmonic components may be attenuated by a high pass filter.

In an 80 kV HVDC system, an MTF filter that compensates for reactive power of 17 Mvar and a high pass filter that compensates for reactive power of 17 Mvar may be used. The MTF may have a high-voltage capacitor bank and a low-voltage air core reactor that are connected in series, and a low-voltage capacitor bank and an air core reactor that are connected in parallel. Here, the harmonic filter may serve to supply reactive power to a system at 60 Hz.

Figure 2:
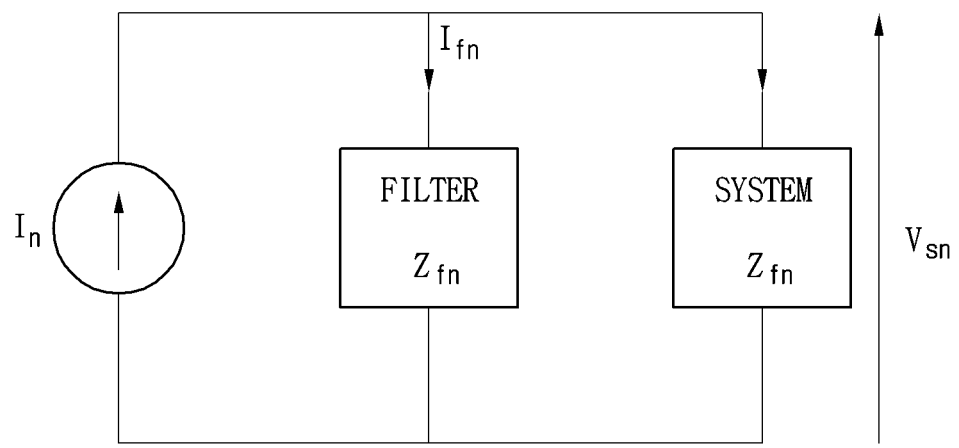
FIG. 2 is a circuit diagram illustrating a harmonic equivalent model corresponding to an HVDC system into which a harmonic filter is inserted.

FIG. 2 is a circuit diagram illustrating a harmonic equivalent model corresponding to an HVDC system into which a harmonic filter is inserted.

Referring to FIG. 2, the current-type HVDC converter may absorb reactive power from the AC system, and supply necessary reactive power to the converter through the harmonic filter.

Such an HVDC converter can be modeled as a harmonic constant current source at an alternating current (AC) stage and also be modeled as a harmonic constant voltage source at a direct current (DC) stage. Since the harmonic filter serves to suppress harmonics generated in the HVDC converter from being introduced into the AC system, a harmonic equivalent model using an AC constant current harmonic source may be used as illustrated in FIG. 2.

Here, In denotes a harmonic current generated from the HVDC converter, and Ifn and Isn denote harmonic currents that flow into the filter and the AC system, respectively. Zfn and Zsn denote harmonic impedances in the AC system, and Vsn denotes a harmonic voltage in the AC system.

Performance of the harmonic filter depends on an admittance of the AC system, and the admittance of the AC system varies with time according to a state of an actual power system. Thus it is very difficult to find an accurate admittance at a given frequency. Accordingly, when the harmonic filter is designed, the admittance may be determined by plotting the admittance with respect to a given frequency on a complex plane having an admittance angle as a boundary.

Figure 3:
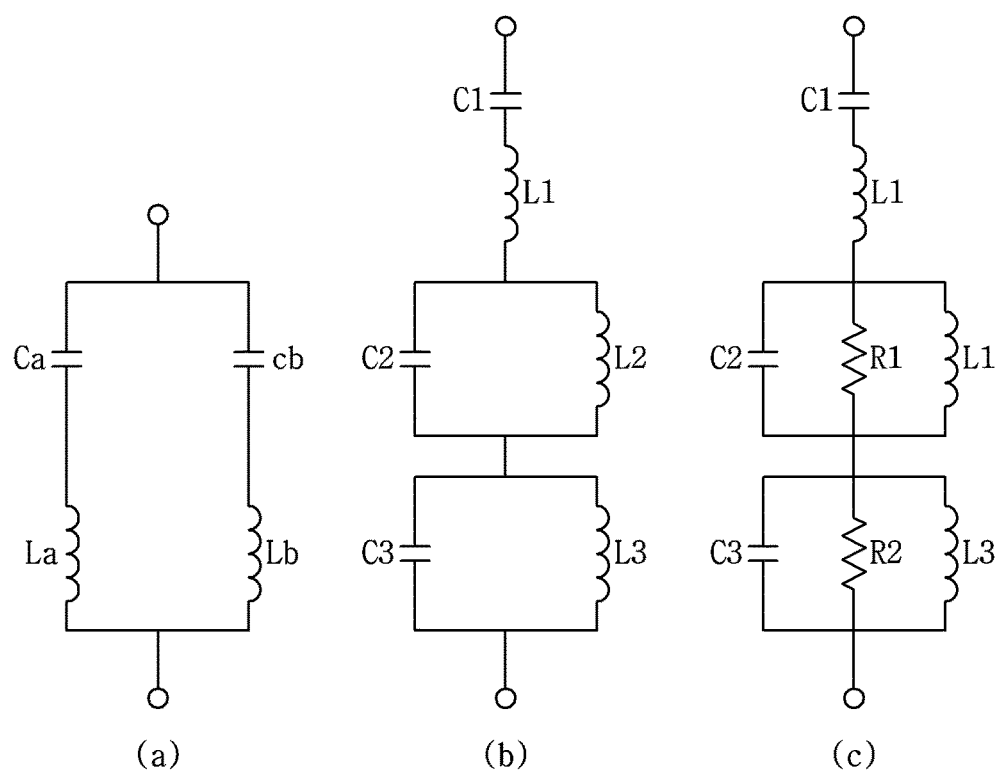
FIG. 3 is an exemplary diagram illustrating a method of designing a multiple-tuned filter (MTF) using an equivalent circuit scheme.

FIG. 3 is an exemplary diagram illustrating a method of designing a multiple-tuned filter (MTF) using an equivalent circuit scheme.

Referring to FIG. 3, harmonic distortion, system reliability, and cost need to be considered when an alternating current filter (or a harmonic filter) is designed in an HVDC system.

The harmonic filter incurs a cost corresponding to one bank. Thus, using a configuration in which one filter bank is connected in parallel, as illustrated in FIGS. 3(b) and 3(c), is more economically advantageous rather than using two single tuned filters (hereinafter referred to as "STFs") in order to remove two harmonics, because the former requires a smaller space than the latter to remove the same number of harmonics. This is because the MTF requires only one switchgear, unlike the STF.

In addition, a damped-type MTF including a damping resistor R connected in parallel to a parallel LC resonance tank may be used as illustrated in FIG. 3(c).

The equivalent circuit scheme may be a method that may be relatively easily used in MTF design.

For the MTF design, a total amount of reactive power to be preferentially compensated may be uniformly distributed to STFs and then parameters for the STFs may be selected.

In selection of the parameters for the STFs, the level of voltage applied to the filter and the amount of reactive power to be compensated by the filter may have to be preferentially determined.

In this case, since a capacitor and an inductor are connected in series in a structure of a serial LC filter, the reactance of the filter may be a difference in reactance between the capacitor and the inductor.

Meanwhile, since the impedance of the entire filter should be 0 at an h-th harmonic to be removed, the reactance of the capacitor is equal to the reactance of the inductor multiplied by the square of h.

According to the above-described MTF design method, the converter of the HVDC generates harmonic current of a predetermined value or higher. Accordingly, a harmonic filter is installed to cause a harmonic current to flow out through the harmonic filter, thereby making distortion of the alternating current voltage fall within an acceptable range.

The 12-pulse converter has $(12n\pm1)$th characteristic harmonics. Accordingly, harmonic components that should be filtered out may be 11th, 13th, 23rd, and 25th components, and the higher order harmonic components may be attenuated by a high pass filter.

The MTF may have a high-voltage capacitor bank and a low-voltage air core reactor that are connected in series, and a low-voltage capacitor bank and an air core reactor that are connected in parallel. In addition, the MTF may also be formed by connecting a plurality of parallel LC resonance tanks in series according to harmonics to be removed.

The harmonic filter serves to supply reactive power to a system at 60 Hz. Accordingly, terminals of a rectifier and an inverter absorb reactive power in proportion to active power exchanged between the converter and the AC system. The harmonic filter is able to supply necessary reactive power to the converter because the harmonic filter uses a capacitor. When reactive power is sufficiently compensated by the filter, an AC voltage at the terminal may not have a level sufficient to normally operate the converter.

Meanwhile, the HVDC converter may be modeled as the harmonic constant voltage source at the DC stage, and also modeled as the harmonic constant current source at the AC stage. Since one of roles of the filter is to prevent harmonics generated by the HVDC converter from being introduced into the system, thus modeling for analysis of the harmonics at the AC stage is required.

Here, a filter and a power system (e.g., an AC system) connected to the filter may be represented or modeled with impedances.

The filter may be designed after determining how much the harmonic current generated by the converter flows into the system, and harmonic characteristics of voltage resulted therefrom by using the model in FIG. 2.

In order to improve stability of a relation between the filter and the power system connected to the filter, filter design may be easily realized by changing the resistance of the filter.

Hereinafter, an MTF design algorithm according to a first embodiment will be described in detail below with reference to FIGS. 4 to 6.

Figure 4:
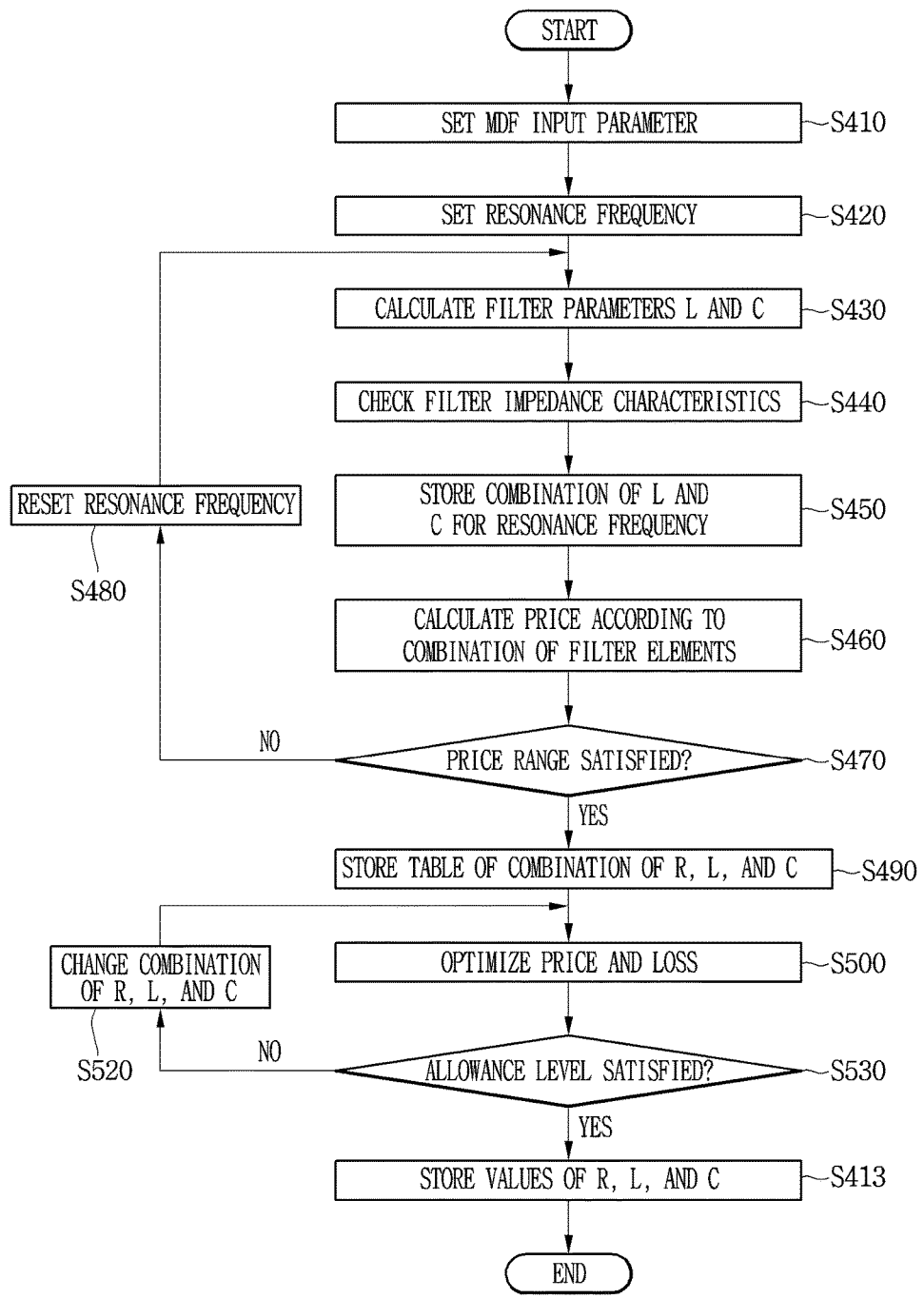
FIG. 4 is a flowchart illustrating a method of designing an MTF according to an embodiment.
Figure 5:
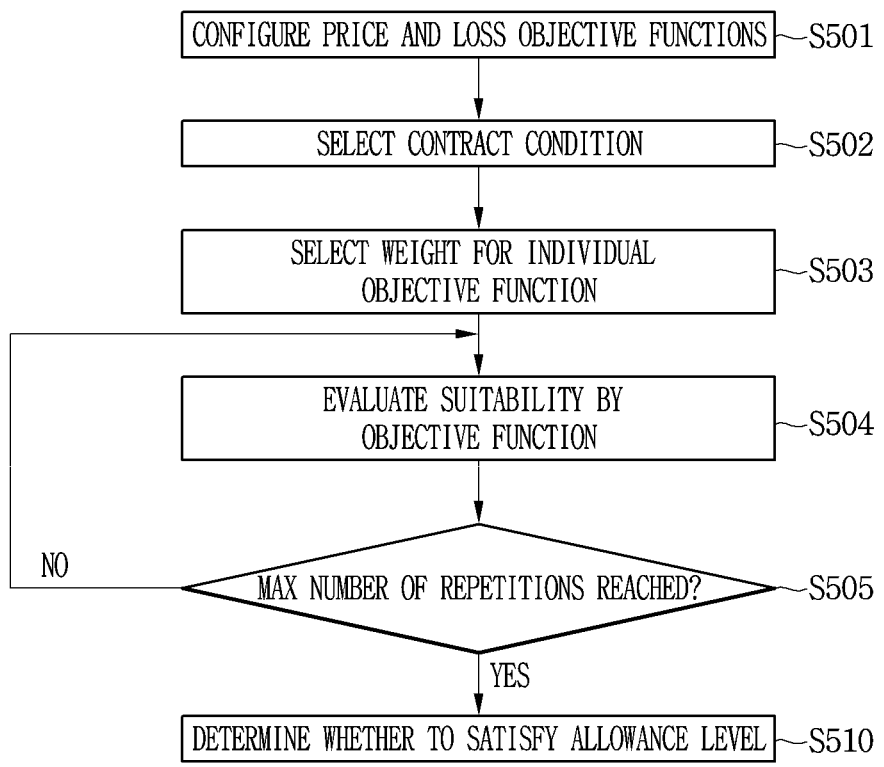
FIG. 5 is a flowchart illustrating a price and loss optimization process according to an embodiment.

FIG. 4 is a flowchart illustrating a method of designing an MTF according to a first embodiment.

Referring to FIG. 4, an MTF design algorithm according to an embodiment may include the following procedure.

First, an input parameter corresponding to an MTF is set (S410). The input parameter corresponding to the MTF should be set when an optimal filter parameter corresponding to the MTF is set.

The input parameter is a parameter associated with rating or target performance of the MTF and may include at least one of a rating voltage of a load or system connected to the MTF, reactive power to be compensated by the MTF, and a filtering frequency.

The load or system connected to the MTF may be a power system (for example, an AC system) of the HVDC system.

The filtering frequency is a frequency to be filtered out by the MTF, and may include a first filtering frequency and a second filtering frequency greater than the first filtering frequency. For example, when harmonic components to be filtered out are 11th and 13th harmonic components, the first filtering frequency is a frequency corresponding to the 11th harmonic component, and the second filtering frequency is a frequency corresponding to the 13th harmonic component.

Thereafter, the resonance frequency of the MTF is set (S420). That is, an initial value of the resonance frequency is set, and the setting of the resonance frequency may be performed on the basis of a filtering frequency to be filtered out by the multiple-tuned filter (MTF).

For example, the resonance frequency may be set as a frequency ranging between the first filtering frequency and the second filtering frequency, and the resonance frequency may be reset by combining values of L and C when a resonance frequency that is initially input to set filter parameters does not satisfy the price range.

The resonance frequency may be set as the first filtering frequency, which is an initial value.

Next, the values of L and C, which are filter parameters, constituting the impedance of the filter are calculated (S430).

For example, the MTF may include a first LC circuit, a second LC circuit, and a third LC circuit. The first LC circuit may have a first capacitor and first inductor that are connected in series, and the second LC circuit may have a second capacitor and a second inductor that are connected in parallel. The third LC circuit may have a structure in which a third capacitor and a third inductor are connected in parallel.

In this case, the MTF parameter may include at least one of a capacitance of the first capacitor, an inductance of the first inductor, a capacitance of the second capacitor, an inductance of the second inductor, a capacitance of the third capacitor, and an inductance of the third inductor. A resonance frequency of the filter may be a parallel resonance frequency corresponding to the second LC circuit and the third LC circuit.

Next, filter impedance characteristics of the calculated values of L and C are checked (S440), and the values of L and C are combined for each resonance frequency and then stored (S450). That is, the values of L and C when the checked filter impedance falls within a predetermined threshold range are listed and stored in a table for each resonance frequency.

Afterwards, a resistance component, which is a filter element, is set, and a process of calculating a price of the filter including the resistance component is performed (S460).

For example, a value of the resistance component (resistance) may be set to a minimum resistance and a maximum resistance, which may be set in consideration of the amount of reactive power required for stabilization with respect to a system or load connected to the MTF.

That is, an RLC combination table may be achieved by adding the resistance designed in consideration of the reactive power to the values of L and C in the range in which the filter impedance satisfies a predetermined threshold.

Next, when the values of R, L, and C are determined, it is determined whether the values are within a predetermined price range (S470). When the values of R, L, and C are determined to exceed the predetermined price range, a process of resetting a resonance frequency that is set for the values is performed (S480).

That is, although the values of L and C in the filter impedance satisfy the threshold, it is determined whether the filter having an added resistance component, which is a filter element, has market competitiveness in terms of the price. When it is determined that the design costs are greater than an expected amount, the resonance frequency is reset, and thus the values of L, C, and R are reset according to the reset resonance frequency.

On the contrary, when the designed values of L, C, and R are within a price range that is set as an upper limit, the values of L, C, and R and a resonance frequency corresponding to the values are stored together in a table (S490).

Next, a price and loss optimization process is performed to select an optimal RLC combination in consideration of the price and the performance loss of the filter (S500).

Here, the price and loss optimization process (S500) will be described below, focusing on a process described in FIG. 5.

The price and loss optimization may be largely classified into a process of checking the prices of R, L, and C constituting the filter and the price of the filter resulted from the combination of R, L and C, and a process of checking performance losses for filter combinations, which are determined on the basis of the price.

First, an objective function of a price and a loss is formed (S501).

That is, a first objective function, which is a price function for individual filter elements, may be determined using Equation (1) below:

$$F_1 = \min \sum_{i=1}^{n} aC_i + bR_i + cL_i \qquad \text{(Eq. 1)}$$

where n is the number of filters, a is a price constant for a capacitor, b is a price constant for a resistor, and c is a price constant for a reactor.

That is, each of designed filters may be assigned its price data by using price information regarding R, L, and C constituting the filter and the number of each of these elements.

A loss function, which is a second objective function, may be determined using Equation (2) below:

$$F_2 = \min \sum_{i=1}^{n} dC_i + eR_i + fL_i \qquad \text{(Eq. 2)}$$

where n is the number of filters, d is a loss constant for a capacitor, e is a loss constant for a resistor, and f is a loss constant for a reactor.

That is, each of the designed filters may be assigned its loss data using loss information regarding R, L, and C constituting the filter and the number of each of these elements.

The reason why the loss should be considered in filter design is that an associated institution (e.g., Korea Electric Power Corporation) has a right to deny taking over facilities when a total loss or losses of elements exceed a limited value specified in an associated standard or exceed 10% of the entire system loss. Accordingly, a person who designs/installs the HVDC system should consider the loss.

When the associated institution decides to take over the facilities, a contactor may pay damages for the associated institution, and the damages may be calculated using Equation 3 below:

$$\text{Penalty }(W) = (\Sigma P_{excess}(\text{kwh}) \times K_{loss}) \times \frac{\left[1 - \left(\frac{1}{1.10}\right)^{20}\right]}{1.10 - 1} \qquad \text{(Eq. 3)}$$

where $\Sigma \text{Pexcess}$ is an excessive loss of an average probability distribution of the reactive power compensation device, and the unit is kWh.

The excessive loss $\Sigma \text{Pexcess}$ may be determined by any one of Equations 4 to 6 below, which is selected according to the level of reactive power:

$$\Sigma P_{excess}(\text{kWh}) = \int_{-400}^{400} y(x) \times 13 \times f(x) \times 8,760(h) \qquad \text{(Eq. 4)}$$

Equation 4 is an equation indicating an excessive loss that may be generated for reactive power within range of ±400 MVar.

$$\Sigma P_{excess}(\text{kWh}) = \int_{-450}^{450} y(x) \times 15 \times f(x) \times 8{,}760(h) \quad \text{(Eq. 5)}$$

Equation 5 is an equation indicating an excessive loss that may be generated for reactive power within the range of ±450 MVar SVC (symmetry).

$$\Sigma P_{excess}(\text{kWh}) = \int_{-225}^{675} y(x) \times 15 \times f(x) \times 8{,}760(h) \quad \text{(Eq. 6)}$$

Equation 6 is an equation indicating an excessive loss that may be generated for reactive power within the range from −225 MVar to +675 MVar SVC (asymmetry).

When the objective function of the prices of the elements constituting the filter (first objective function) and the objective function for calculating a loss generated from each element (second objective function) are selected, a table of the prices and losses for designing filter elements may be formed.

Next, a process of selecting a constraint is performed (S502). Here, the constraint may include a total harmonic distortion (THD), which is not directly associated with suitability evaluation and is applied as a minimum necessary condition when a combination of L and C is selected. For example, although the combination of L and C falling within a limited range that is specified in a standard is selected through the suitability evaluation, the design of the filter may be determined as failure when the combination is connected to the system to perform a THD test and determined to be equal to or less than a threshold (e.g., THD 1.5%).

That is, a failed design may be easily removed from among the designed filters using the THD in terms of the price and loss.

Next, a process of selecting a weight w for each objective function (first or second objective function) may be performed (S503). The weight w is a penalty cost for the loss and used to integrate units of the objective functions.

When the weight is applied to a case in which a penalty needs to be given, the weight w is expressed as multiplication of constants multiplied with kWh.

$$w = K_{loss} \times \frac{\left[1 - \left(\frac{1}{1.10}\right)^{20}\right]}{1.10 - 1} \quad \text{(Eq. 7)}$$

The weight w may be applied according to a standard that is represented as Equation 7 above and may vary depending on various situations and conditions. Considering only the harmonic filter but not the entire system, the weight w can be configured by introducing a new factor that considers a ratio of the harmonic filter loss to the entire system loss.

Next, a process of evaluating suitability by the objective function is performed (S504). By assigning weights to the objective functions, an objective function having an integrated unit may be calculated to evaluate suitability using Equation (8) below:

$$G(x) = F1 + wF2 \quad \text{(Eq.8)}$$

Among combinations of values of L and C satisfying the price category range selected through the filter design, combinations falling within a limited range that is specified in the standard may be selected through the suitability evaluation. That is, by representing a function including price information regarding the filter and functions including performance losses of the filter as a single function $G(x)$, designs when a value of $G(x)$ is not included in a predetermined threshold range may be removed from among the designed combinations of values of L and C.

Next, the number of combinations of R, L, and C, which are filter elements, is the maximum number of repetitions, and the suitability evaluation is repeated the maximum number of times (S505). R, L, and C are determined to have the minimum suitability, and then the algorithm is completed.

It may be determined whether the calculated individual harmonic component or total harmonic distortion is equal to or less than a predetermined threshold (S510). Here, the threshold may be determined on the basis of performance, standard, or design specification that is required for the MTF. For example, the threshold may be determined on the basis of an allowance level in IEEE Std.519.

When the total harmonic distortion does not satisfy the allowance level, the total harmonic distortion is calculated again after changing the combination of R, L, and C. In addition, the values of R, L, and C satisfying the allowance level and a resonance frequency corresponding thereto are stored and managed together (S520).

Next, the MTF is connected to a load or system on the basis of the above combined resistance.

Although the same MTF is designed through this process, a design of a combination of optimal filter elements R, L, and C considering economic feasibility is possible.

In addition, when prices for R, L, and C are predetermined in the threshold price range, and prices that are determined when R, L, and C are combined are outside the predetermined price range, the combination of R, L, and C may be changed, thereby simply determining economic feasibility of various combinations.

Figure 6:
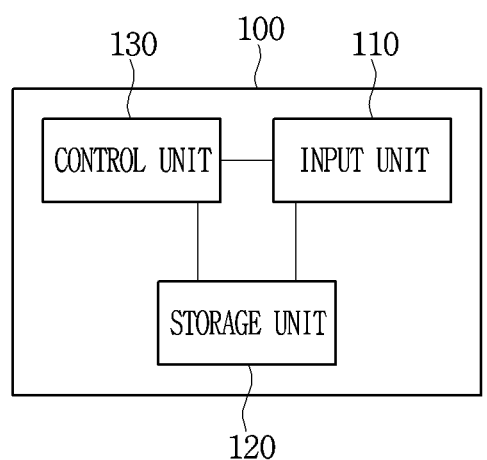
FIG. 6 is a block diagram illustrating a filter parameter setting device of an MTF according to an embodiment.

FIG. 6 is a block diagram illustrating a filter parameter setting device of an MTF according to an embodiment.

Referring to FIG. 6, the filter parameter setting device 100 may include an input unit 110, a storage unit 120, and a control unit 130.

The input unit 110 may serve to receive an input parameter and a resistance corresponding to the MTF.

The input unit 110 may generate input data for controlling an operation of the filter parameter setting device 100 by a user. The user input unit 110 may include a keypad, a dome switch, a touch pad, a jog wheel, or a jog switch.

In addition, the input unit 110 serves as an interface with all external devices that are connected to the filter parameter setting device 100.

The storage unit 120 may store a program for processing and controlling the control unit 130 and may perform a function of temporarily storing input/output data (input parameters and resistances) and result data operated and calculated by the control unit 130 or a function of storing final result data.

The control unit 130 may serve to perform control of an overall operation executed by the filter parameter setting device 100.

The control unit 130 may be implemented as a micro controller, a microprocessor, or the like. The control unit 130 may set a resonance frequency corresponding to the MTF and a resistance within a predetermined threshold. In addition, the control unit 130 may set a parameter corresponding to the MTF on the basis of the input parameter, the resonance frequency, and the resistance.

The control unit 130 may determine whether the individual harmonic component or total harmonic distortion satisfies a threshold level and reset the resonance frequency according to the determination result.

The control unit 130 may set or reset the resistance within a predetermined threshold in order to secure stability because a load or system is connected to the MTF.

Meanwhile, another embodiment of the MTF design method will be described in detail below with reference to FIG. 7.

Figure 7:
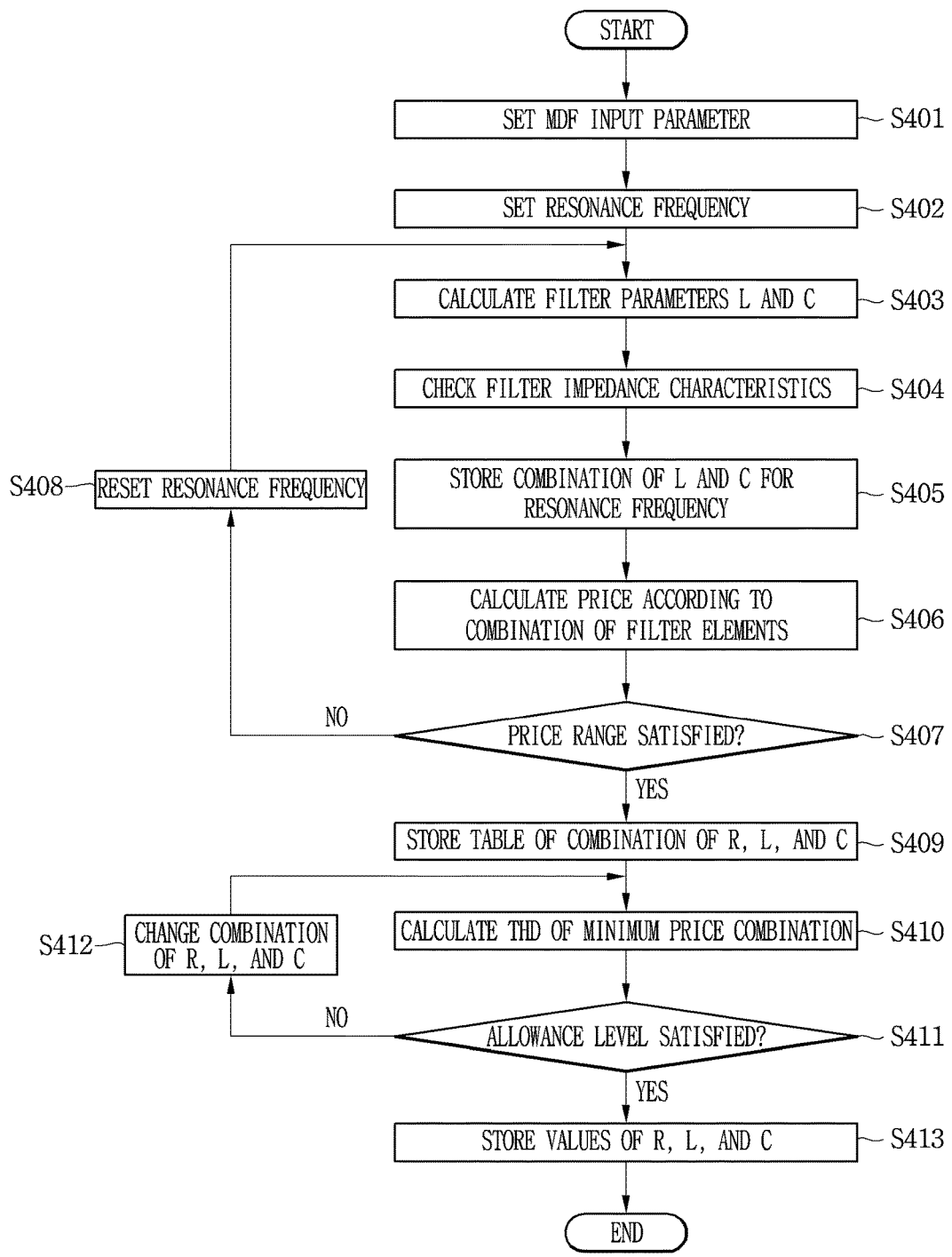
FIG. 7 is a flowchart illustrating a method of designing an MTF according to a second embodiment.

FIG. 7 is a flowchart illustrating a method of designing an MTF according to a second embodiment.

Referring to FIG. 4, an MTF design algorithm according to an embodiment may include the following steps.

First, an input parameter corresponding to an MTF is set (S402). The input parameter corresponding to the MTF should be set in an optimal filter parameter setting corresponding to the MTF.

The input parameter is a parameter associated with rating or target performance of the MTF and may include at least one of a rating voltage of a load or system connected with the MTF, reactive power to be compensated by the MTF, and a filtering frequency.

The load or system connected to the MTF may be a power system (for example, an AC system) of the HVDC system.

The filtering frequency is a frequency to be filtered out by the MTF and may include a first filtering frequency and a second filtering frequency greater than the first filtering frequency. For example, when harmonic components to be filtered out are 11th and 13th harmonic components, the first filtering frequency is a frequency corresponding to the 11th harmonic component, and the second filtering frequency is a frequency corresponding to the 13th harmonic component.

In addition, the resonance frequency of the MTF is set (S402). That is, an initial value of the resonance frequency is set, and the setting of the resonance frequency may be performed on the basis of a filtering frequency to be filtered out by the multiple-tuned filter (MTF).

For example, the resonance frequency may be set as a frequency falling within the range between the first filtering frequency and the second filtering frequency, and the resonance frequency may be reset by combining values of L and C when a resonance frequency that is initially input to set filter parameters does not satisfy the price category range.

The resonance frequency may be set as the first filtering frequency, which is an initial value.

Next, the value of L and the value of C, which are filter parameters constituting the impedance of the filter are calculated (S403).

For example, the MTF may include a first LC circuit, a second LC circuit, and a third LC circuit. The first LC circuit may have a first capacitor and first inductor that are connected in series, and the second LC circuit may have a second capacitor and a second inductor that are connected in parallel. The third LC circuit may have a structure in which a third capacitor and a third inductor are connected in parallel.

In this case, the MTF parameter may include at least one of a capacitance of the first capacitor, an inductance of the first inductor, a capacitance of the second capacitor, an inductance of the second inductor, a capacitance of the third capacitor, and an inductance of the third inductor. A resonance frequency of the filter may be a parallel resonance frequency corresponding to the second LC circuit and the third LC circuit.

Next, filter impedance characteristics of the calculated values of L and C are checked (S404), and the values of L and C are stored in combination for each resonance frequency (S405). That is, when the checked filter impedance falls within a predetermined threshold range, the values of L and C are stored as a table for each resonance frequency.

Next, a resistance component, which is a filter element, is set, and a process of calculating a price of the filter including the resistance component is performed (S406).

For example, a value of the resistance component (a resistance) may be set with a minimum resistance and a maximum resistance, which may be set in consideration of the amount of reactive power required for stabilization with respect to a system or load connected to the MTF.

That is, an RLC combination table may be written by adding the resistance designed in consideration of the reactive power to the values of L and C in the range in which the filter impedance satisfies a predetermined threshold.

Next, when the values of R, L, and C are determined, it is determined whether the values are outside a predetermined price range (S407). When the values of R, L, and C are determined to exceed the predetermined price range, a process of resetting a resonance frequency that is set for the values is performed (S408).

That is, although the values of L and C in the filter impedance satisfy the threshold, it is determined whether the filter having an added resistance component, which is a filter element, has market competitiveness in terms of the price. When it is determined that the cost of the design is greater than an expected amount, the resonance frequency is reset, and thus the values of L, C, and R are reset according to the reset resonance frequency.

On the contrary, when the designed values of L, C, and R are within a price range that is set as an upper limit, the values of L, C, and R and a resonance frequency corresponding to the values are stored together as a table (S409).

Next, an individual harmonic component or total harmonic distortion (THD) is calculated on the basis of values of R, L, and C for each resonance frequency (S410).

According to an embodiment, the individual harmonic component may be a harmonic component corresponding to a harmonic current generated by the HVDC converter included in the HVDC system, and the total harmonic distortion may be THD corresponding to the harmonic current.

It may be determined whether the calculated individual harmonic component or total harmonic distortion is equal to or less than a predetermined threshold (S411). Here, the threshold may be determined on the basis of performance, standard, or design specification that is required for the MTF. For example, the threshold may be determined on the basis of an allowance level in IEEE Std.519.

When the total harmonic distortion does not satisfy the allowable level, the total harmonic distortion is calculated again after changing the combination of R, L, and C (S412). In addition, the values of R, L, and C satisfying the allowance level and a resonance frequency corresponding thereto are stored and managed together (S412).

Next, the MTF is connected to a load or system on the basis of the above combined resistance.

Although the same MTF is designed through this process, a design of a combination of optimal filter elements R, L, and C considering economic feasibility is possible.

In addition, when prices for R, L, and C are predetermined in the threshold price range, and prices that are determined when R, L, and C are combined are outside the predetermined price range, the combination of R, L, and C may be changed, thereby simply determining economic feasibility of various combinations.

Although the same MTF is designed through the proposed design method, the MTF can be designed with a combination of optimal filter elements R, L, and C considering economic feasibility.

In addition, it is possible to design a filter in consideration of prices and losses of elements constituting the filter, and resultantly a filter with high efficiency can be designed at a minimum cost.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of designing a multiple-tuned filter (MTF) of a high voltage direct current (HVDC) system, the method comprising:
    selecting an input parameter for the MTF;
    setting a resonance frequency of the MTF;
    calculating values of a inductance (L) and a capacitance (C) which are filter parameters of the MTF on the basis of the input parameter and the resonance frequency;
    combining a value of a resistance (R) with the filter parameters and calculating a price according to the combination; and
    storing the combined values of R, L, and C when the calculated price falls within a predetermined price range.

2. The method of claim 1, further comprising resetting the resonance frequency when the calculated price falls outside the predetermined price range.

3. The method of claim 2, further comprising recalculating the values of L and C on the basis of the reset resonance frequency after resetting the resonance frequency.

4. The method of claim 1, further comprising, after the storing of the combined values of R, L, and C:
    calculating an individual harmonic component or total harmonic distortion of the values of R, L, and C; and
    determining whether the calculated individual harmonic component or total harmonic distortion satisfies an allowance value.

5. The method of claim 4, further comprising connecting a load or system on the basis of the combined value of R when the calculated individual harmonic component or total harmonic distortion satisfies the allowance value.

6. The method of claim 4, further comprising changing a combination of the combined values of R, L, and C when the calculated individual harmonic component or total harmonic distortion does not satisfy the allowance value.

7. The method of claim 1, further comprising evaluating suitability of the combined values of R, L, and C using a first objective function for a price of each of elements corresponding to the combined values of R, L, and C and a second objective function for representing a performance loss of the element.

8. The method of claim 7, wherein the evaluating of the suitability of the combined values of R, L, and C comprises:
    calculating an individual harmonic component or total harmonic distortion of the values of R, L, and C; and
    determining whether the calculated individual harmonic component or total harmonic distortion satisfies an allowance value.

9. The method of claim 8, wherein the evaluating of the suitability of the combined values of R, L, and C comprises assigning a predetermined weight to the first or second objective function and then summing the first objective function and the second objective function to calculate a single objective function.

10. The method of claim 9, wherein, when a value of the determined single objective function falls within a predetermined threshold range, design of a filter including the combination of the value of R, L, and C is allowed.

* * * * *